(12) United States Patent
Shin et al.

(10) Patent No.: US 7,871,913 B2
(45) Date of Patent: Jan. 18, 2011

(54) METHOD FOR MANUFACTURING SEMICONDUCTOR DEVICE HAVING VERTICAL TRANSISTOR

(75) Inventors: Jong Han Shin, Seoul (KR); Hyung Soon Park, Gyeonggi-do (KR); Jum Yong Park, Gyeonggi-do (KR); Sung Jun Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 63 days.

(21) Appl. No.: 12/335,668

(22) Filed: Dec. 16, 2008

(65) Prior Publication Data

US 2009/0170302 A1    Jul. 2, 2009

(30) Foreign Application Priority Data

Jan. 2, 2008    (KR) .................. 10-2008-0000302

(51) Int. Cl.
*H01L 21/3205* (2006.01)
*H01L 21/4763* (2006.01)

(52) U.S. Cl. ............... 438/589; 438/156; 257/E21.294; 257/E21.429; 257/E21.621

(58) Field of Classification Search ............ 438/589, 438/156; 257/E21.294, E21.429, E21.045, 257/E21.612, E21.621
See application file for complete search history.

(56) References Cited

U.S. PATENT DOCUMENTS 5,637,898 A * 6/1997 Baliga .................. 257/330
6,319,777 B1 * 11/2001 Hueting et al. ............ 438/270
6,509,260 B1 * 1/2003 Evans et al. ................ 438/631
7,122,478 B2 * 10/2006 Han et al. .................. 438/710
7,531,874 B2 * 5/2009 Son et al. ................... 257/334
2008/0124869 A1 * 5/2008 Yoon et al. ................. 438/268

FOREIGN PATENT DOCUMENTS

| KR | 1020030051047 A | 6/2003 |
| KR | 1020060041415 A | 5/2006 |
| KR | 10-0660881 B1 | 12/2006 |
| KR | 1020070033731 A | 3/2007 |

* cited by examiner

*Primary Examiner*—Caridad M Everhart
(74) *Attorney, Agent, or Firm*—Ladas & Parry LLP (57) ABSTRACT

A method for manufacturing a semiconductor device having a vertical transistor includes forming hard masks on a semiconductor substrate to expose portions of the semiconductor substrate. Then the exposed portions of the semiconductor substrate are etched to define grooves in the semiconductor substrate. A gate conductive layer is formed on the hard masks and surfaces of the grooves to a thickness that does not completely fill the grooves. A sacrificial layer is formed on the gate conductive layer to completely fill the grooves. A partial thickness of the sacrificial layer is removed to expose the gate conductive layer and portions of the gate conductive layer formed on the hard masks and on sidewalls of upper portions of the grooves are removed. The remaining sacrificial layer is completely removed. Gates are formed on sidewalls of lower portions of the grooves by etching the gate conductive layer.

19 Claims, 6 Drawing Sheets

METHOD FOR MANUFACTURING SEMICONDUCTOR DEVICE HAVING VERTICAL TRANSISTOR

CROSS-REFERENCE TO RELATED APPLICATIONS

The present application claims priority to Korean patent application number 10-2008-0000302 filed on Jan. 2, 2008, which is incorporated herein by reference in its entirety.

BACKGROUND OF THE INVENTION

The present invention relates generally to a method for manufacturing a semiconductor device having a vertical transistor, and more particularly to a method for manufacturing a semiconductor device having a vertical transistor which can stabilize manufacturing processes.

The integration level of a semiconductor device continues to increase, the area of a unit cell decreases when viewed from above. Methods for forming a transistor, a bit line, a word line, and a capacitor within a limited area have been researched due to the decreasing area of the unit cell.

A semiconductor device having a transistor in which a source area and a drain area are positioned up and down in an active region to define a vertical channel, have been proposed. Such a transistor will be hereinafter referred to as a "vertical transistor".

In the vertical transistor a silicon pillar is formed by etching a semiconductor substrate using a hard mask made of a nitride layer as an etch mask, a gate is formed on the sidewall of a lower portion of the silicon pillar, a source area is formed in an upper portion of the silicon pillar over the gate, and a drain area is formed in the semiconductor substrate beneath the silicon pillar.

In the semiconductor device having the vertical transistor structured as described above, by decreasing a cell scheme from a conventional 8F2 to 4F2, a net die can be significantly increased. Further, in the semiconductor device having the vertical transistor, gate drivability can be improved because a surrounding gate is formed. In addition, the characteristics and the reliability of the semiconductor device having the vertical transistor can be ensured, even when the area of the transistor is decreased, because the length of the channel does not decrease.

While not illustrated and explained in detail, in the conventional art, when manufacturing the semiconductor device having the vertical transistor, the hard mask made of a nitride layer is employed as etch and polish barriers at least three times in the course of forming the silicon pillar and the gate. In order to secure a process margin, the nitride layer for the hard mask is formed to a thickness over 1,500 Å. However, presence of the thick nitride layer for the hard mask is problematic because both the nitride layer for the hard mask and the silicon pillar are likely to lean while conducting a process.

Further, in the conventional art, a polysilicon layer for the gate is deposited to fill a space having a great aspect ratio, and as a result voids are likely to be produced in the space. Due to this fact, the loss of the semiconductor substrate can be caused when etching the polysilicon layer, whereby the characteristics of the semiconductor device can deteriorate.

In addition, in the conventional art, because the polysilicon layer for the gate is likely to remain on the sidewall of the upper portion of the silicon pillar, a short circuit can occur between adjoining gates.

SUMMARY OF THE INVENTION

Embodiments of the present invention include a method for manufacturing a semiconductor device having a vertical transistor, which can prevent a nitride layer for hard masks and silicon pillars from leaning.

Embodiments of the present invention also include a method for manufacturing a semiconductor device having a vertical transistor, which can prevent the etch loss of a semiconductor substrate.

Embodiments of the present invention further include a method for manufacturing a semiconductor device having a vertical transistor, which can prevent adjoining gates from being short-circuited with each other.

Embodiments of the present invention include a method for manufacturing a semiconductor device having a vertical transistor, which can stabilize processes.

Further, embodiments of the present invention include a method for manufacturing a semiconductor device having a vertical transistor, which can improve the characteristics of a semiconductor device.

In one embodiment of the present invention, a method for manufacturing a semiconductor device having a vertical transistor comprises the steps of forming hard masks on a semiconductor substrate to expose portions of the semiconductor substrate; defining grooves by etching exposed portions of the semiconductor substrate; forming a gate conductive layer on the hard masks including surfaces of the grooves to a thickness that does not fill the grooves; forming a sacrificial layer on the gate conductive layer to fill the grooves; removing a partial thickness of the sacrificial layer to expose the gate conductive layer; removing portions of the gate conductive layer which are formed on the hard masks and on sidewalls of upper portions of the grooves; removing the remaining sacrificial layer; and forming gates on sidewalls of lower portions of the grooves by etching the gate conductive layer.

The hard masks comprise a stack structure of a pad oxide layer and a pad nitride layer.

The pad nitride layer is formed to a thickness of 500~1,000 Å.

The step of defining the grooves comprises the steps of defining first grooves by anisotropically etching exposed portions of the semiconductor substrate; forming spacers on sidewalls of the first grooves and the hard masks; and defining second grooves by isotropically etching portions of the semiconductor substrate under the first grooves using the hard masks and the spacers as etch masks.

The second grooves are defined to have a width greater than that of the first grooves.

After the step of defining the grooves and before the step of forming the gate conductive layer, the method further comprises the step of forming a gate insulation layer on the hard masks including surfaces of the grooves.

The gate conductive layer comprises a polysilicon layer.

The sacrificial layer is formed as any one oxide layer among an HDP layer, a BPSG layer, an SOD layer, a TEOS layer, a USG layer, and an ALD layer.

The sacrificial layer is formed to a thickness of 500~6,000 Å.

The step of removing the partial thickness of the sacrificial layer to expose the gate conductive layer is implemented through a CMP process or an etch-back process.

The CMP process is conducted using a slurry having polishing selectivity of 100:1~300:1 between an oxide layer and a polysilicon layer.

The CMP process is conducted using a ceria slurry.

The step of removing the portions of the gate conductive layer which are formed on the hard masks and on the sidewalls of the upper portions of the grooves is implemented through a wet etching process.

The wet etching process is conducted using a chemical having etching selectivity of 150:1~300:1 between a polysilicon layer and an oxide layer.

The wet etching process is conducted using $HNO_3$.

The wet etching process is conducted using a chemical which is prepared by adding HF to $HNO_3$.

HF is added to a rate of 0.1~20 wt %.

The step of removing the remaining sacrificial layer is implemented through a wet etching process.

The wet etching process is conducted using HF.

The step of forming the gates is implemented by anisotropically etching the gate conductive layer.

DESCRIPTION OF SPECIFIC EMBODIMENT

Hereafter, the specific embodiment of the present invention will be described in detail with reference to the accompanying drawings.

FIGS. 1A through 1K are cross-sectional views showing the processes of a method for manufacturing a semiconductor device having a vertical transistor in accordance with an embodiment of the present invention.

Figure 1A:
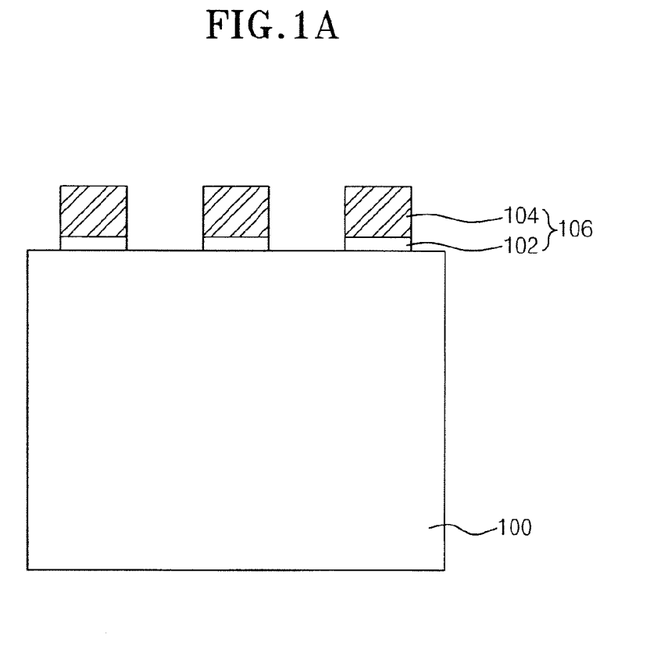
FIGS. 1A through 1K are cross-sectional views showing the processes of a method for manufacturing a semiconductor device having a vertical transistor in accordance with an embodiment of the present invention.

Referring to FIG. 1A, a pad oxide layer 102 and a pad nitride layer 104 are sequentially formed on a semiconductor substrate 100. The pad nitride layer 104 is formed to have a thickness less than 1,500 Å, preferably, a thickness in the range of 500~1,000 Å. Hard masks 106 are formed to expose portions of the semiconductor substrate 100 by etching the pad nitride layer 104 and the pad oxide layer 102.

Figure 1B:
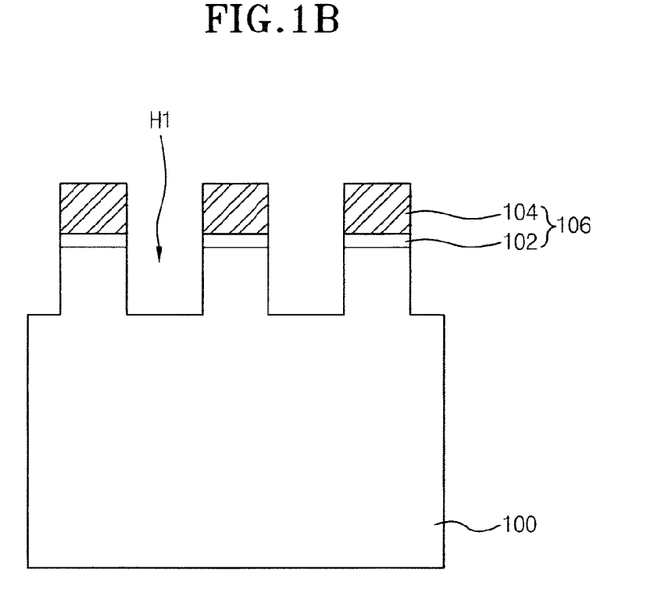

Referring to FIG. 1B, the exposed portions of the semiconductor substrate 100 are etched using the hard masks 106 as etch masks to define first grooves H1 having a predetermined depth in the semiconductor substrate 100. It is preferred that the etching for defining the first grooves H1 be conducted through an anisotropic etching process and the first grooves H1 be defined with an interval in the range of 500~1,500 Å.

Figure 1C:
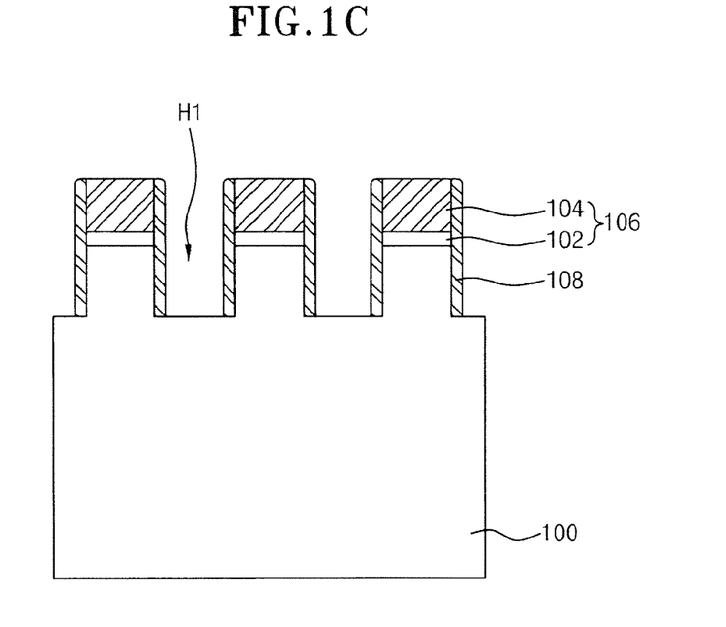

Referring to FIG. 1C, a linear oxide layer and a linear nitride layer (not shown in detail) are formed on the surfaces of the hard masks 106 including the surfaces of the first grooves H1. Subsequently, the linear oxide layer and the linear nitride layer are etched back so as to form spacers 108 on the sidewalls of the first grooves H1 and the hard masks 106.

Figure 1D:
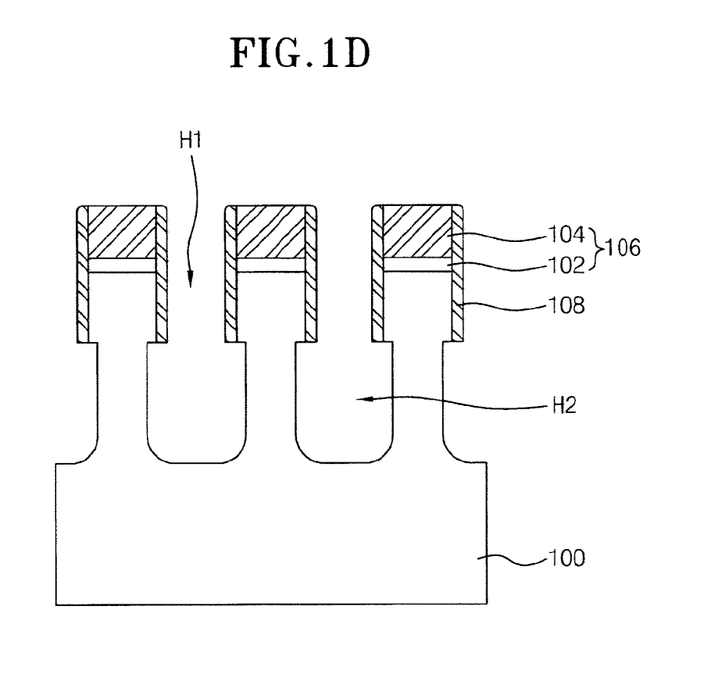

Referring to FIG. 1D, second grooves H2 are defined by etching the semiconductor substrate 100 beneath the first grooves H1 using the hard masks 106 and the spacers 108 as etch masks, and through this, a plurality of silicon pillars are formed. The etching for defining the second grooves H2 is conducted through a wet or dry isotropic etching process. The second grooves H2 are defined to have a width greater than that of the first grooves H1, for example, the second grooves are formed to have a width in the range of 50~200 Å.

Figure 1E:
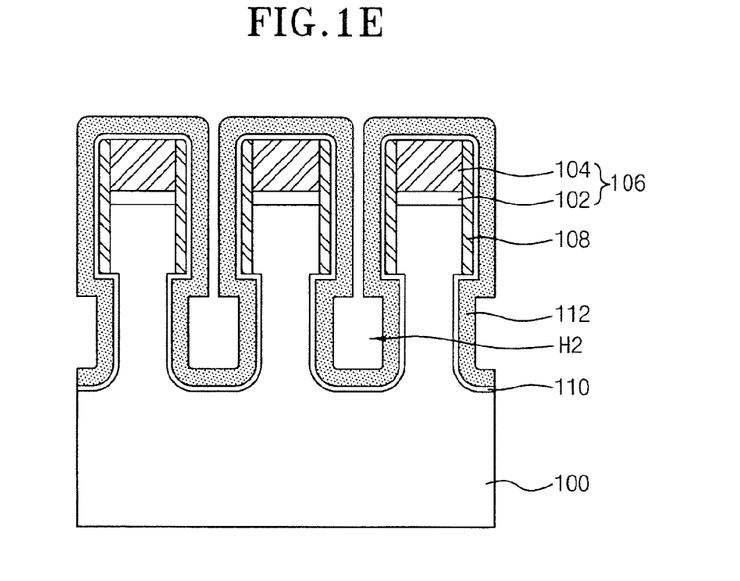

Referring to FIG. 1E, a gate insulation layer 110 is formed on the surfaces of the second grooves H2 including the hard masks 106 and the spacers 108. The gate insulation layer 110 is formed as an oxide layer to have a thickness in the range of 30~80 Å. In the present embodiment the gate insulation layer is formed as an oxide, for example, through a thermal oxidation process or a radical oxidation process. A gate conductive layer 112 is deposited on the gate insulation layer 110 to a uniform thickness. The gate conductive layer 112 is deposited to a predetermined thickness such that the gate conductive layer 112 does not completely fill the first grooves H1 and the second grooves H2, preferably, the gate conductive layer 112 is deposited to a thickness in the range of 100~500 Å. For example, the gate conductive layer 112 may be deposited as a polysilicon layer.

Figure 1F:
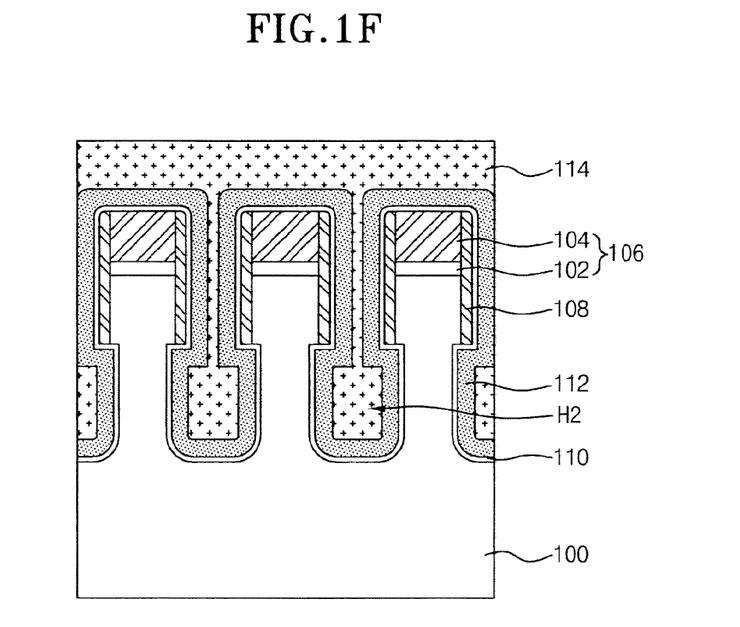

Referring to FIG. 1F, a sacrificial layer 114 is formed on the gate conductive layer 112 to a thickness in the range of 500~6,000 Å so as to completely fill the first grooves H1 and the second grooves H2. In the present embodiment the sacrificial layer 114 may be formed as any one oxide layer among a high density plasma (HDP) layer, a borophosphosilicate glass (BPSG) layer, a spin-on dielectric (SOD) layer, a tetraethyl orthosilicate (TEOS) layer, an undoped silicate glass (USG) layer, and an atomic layer deposition (ALD) layer. Preferably, the sacrificial layer 114 is formed as a flowable oxide layer comprising any one of an SOD layer and a BPSG layer.

Figure 1G:
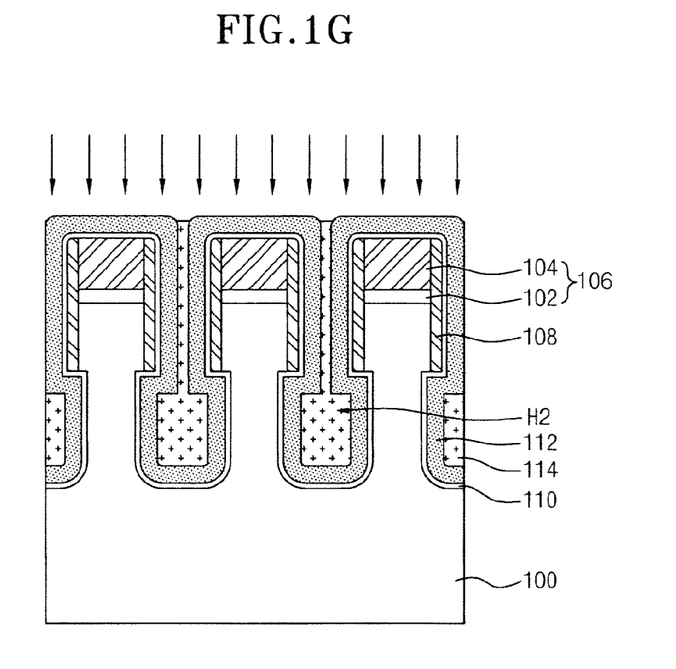

Referring to FIG. 1G, the sacrificial layer 114 is removed through a chemical mechanical polishing (CMP) process or an etch-back process until the gate conductive layer 112 is exposed. The CMP process is conducted using a slurry having polishing selectivity of 100:1~300:1 between an oxide layer and a polysilicon layer, preferably, a ceria slurry. Accordingly, when conducting the CMP process for the sacrificial layer 114, the loss of the gate conductive layer 112 made of a polysilicon layer is minimized, and as a result, the surface of the gate conductive layer 112 exposed after the CMP process can be uniformly maintained.

Figure 1H:
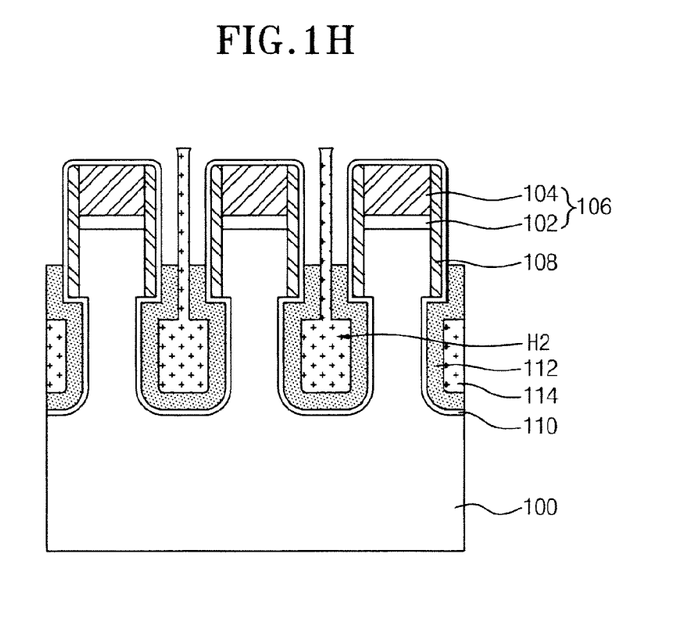

Referring to FIG. 1H, the portions of the gate conductive layer 112 formed on the hard masks 106 and the upper portions of the spacers 108 are removed. At this time, the gate conductive layer 112 in the second grooves H2 is not etched because the sacrificial layer 114 having a sufficient thickness is formed on the gate conductive layer 112 in the second grooves H2.

The removal of the portions of the gate conductive layer 112 is conducted through a wet etching process using a chemical having etching selectivity of 150:1~300:1 between a polysilicon layer and an oxide layer. The wet etching process is conducted using a chemical which is prepared, for example, by adding HF to is $HNO_3$ to a rate in the range of 0.1~20 wt %, preferably, in the range of 0.5~2 wt %. As a result, the loss of the hard masks 106 and the spacers 108 can be minimized when conducting the wet etching process.

Figure 1I:
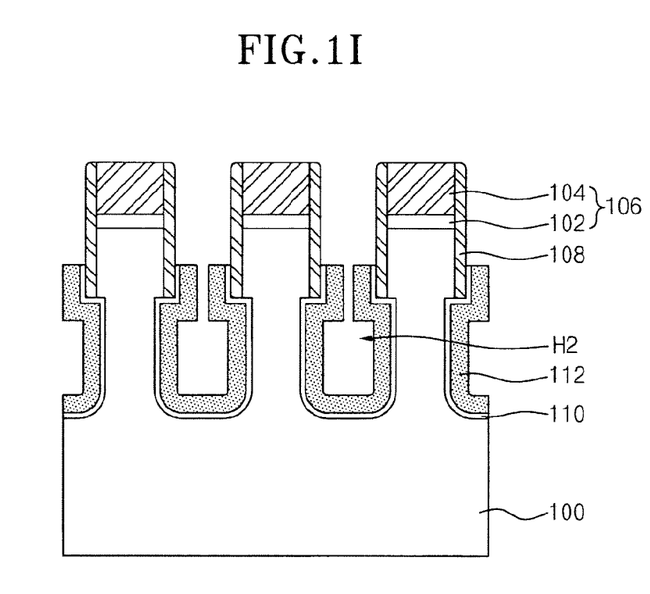

Referring to FIG. 1I, the sacrificial layer 114 is completely removed through a wet etching process using, for example, HF. When conducting the wet etching process, the exposed portions of the gate insulation layer 110 (i.e., the portions of the gate insulation layer 110 not covered by the gate conductive layer 112) are also removed.

In the present invention, it is possible to prevent the polysilicon layer constituting the gate conductive layer 112 from remaining on the sidewalls of the upper portions of the silicon pillars when removing the sacrificial layer 114, because the portions of the gate insulation layer 110 formed on the surfaces of the first grooves H1 (i.e., the sidewalls of the upper portions of the silicon pillars) are completely removed. Since the polysilicon layer constituting the gate conductive layer 112 is prevented from remaining on the sidewalls of the upper portions of the silicon pillars during the removal of the sacrificial layer 114, adjoining gates can be prevented from being short-circuited.

Figure 1J:
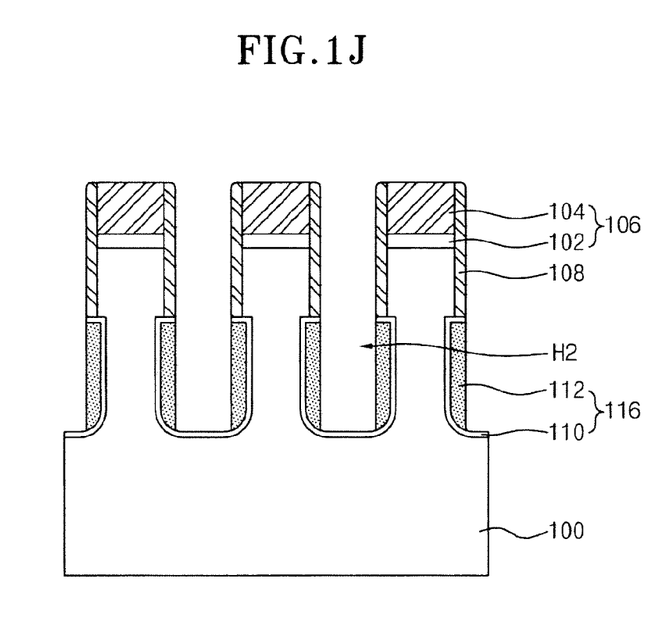

Referring to FIG. 1J, the gate conductive layer 112 is anisotropically etched the gate conductive layer 112 only remains on the sidewalls of the second grooves H2. Through this, gates 116 are formed to have shapes surrounding the lower portions of the silicon pillars. It is preferred that the anisotropic etching be conducted such that the portions of the gate insulation layer 110 on the bottom surfaces of the second grooves H2 and portions of the semiconductor substrate 100 thereunder are not etched.

Figure 1K:
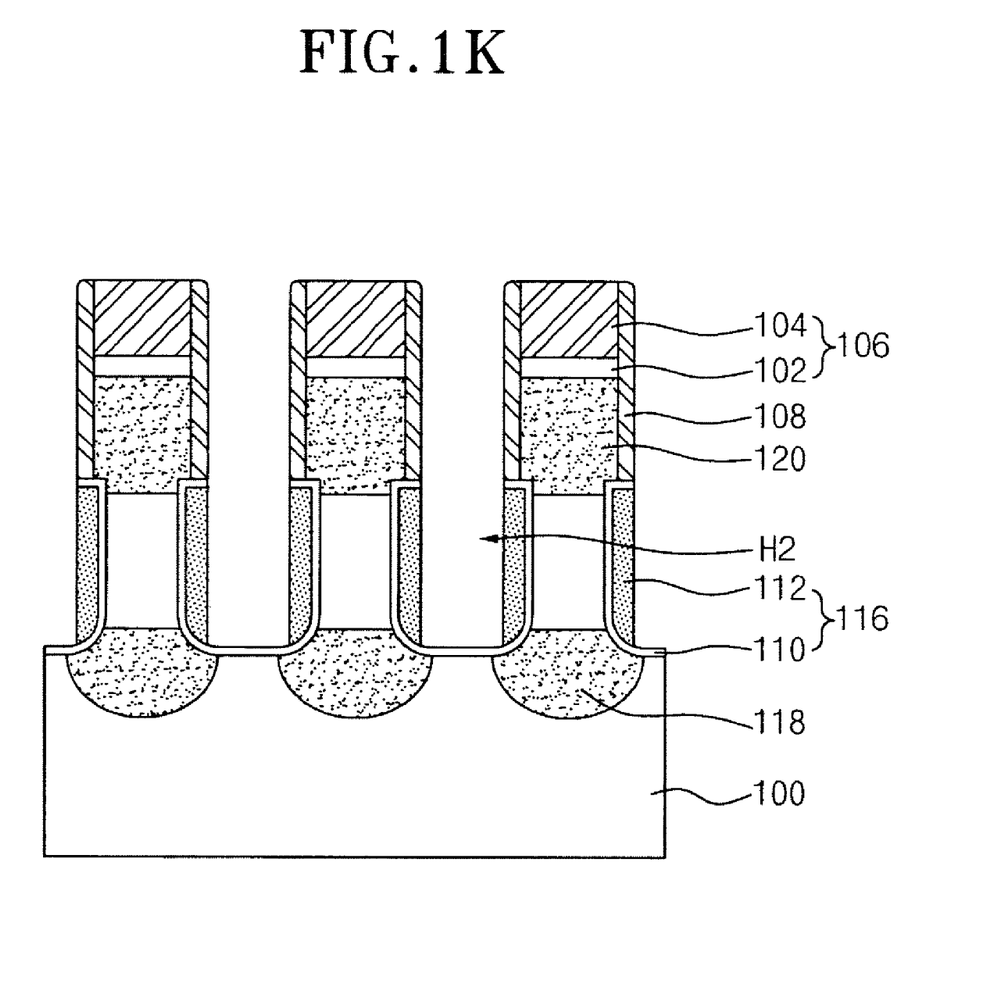

Referring to FIG. 1K, an ion implantation process is conducted in the upper portions of the silicon pillars over the gates 116 and in the portions of the semiconductor substrate 110 under the gates 116 so as to form source areas 120 and drain areas 118.

Thereafter, while not shown in the drawings, by sequentially conducting a series of well-known subsequent processes, the manufacture of a semiconductor device having a vertical transistor according to the embodiment of the present invention is completed.

As is apparent from the above description, in the present invention, etching and CMP processes are conducted by utilizing the etching selectivity and polishing selectivity between an oxide layer and a polysilicon layer. Therefore, in the present invention, hard masks serving as etch and polish barriers can be formed to have a reduced thickness as compared to the conventional art. As a consequence problems associated with the conventional art can be overcome. For example, since the thickness of the hard masks is reduced in the present invention, it is possible to prevent silicon pillars from leaning while forming vertical transistors.

Additionally, since the thickness of the hard masks is reduced in the present invention, it is possible to prevent voids from being produced while depositing the polysilicon layer for a gate conductive layer. Further, since polysilicon residues which are remain on a gate insulation layer in the conventional art can be completely eliminated at the same time when portions of the gate insulation layer formed on the upper ends and the side walls of the silicon pillars are removed according to the present invention, the occurrence of a short circuit between adjoining gates can be prevented.

Therefore, in the present invention, processes can be stabilized and the characteristics of a semiconductor device are improved accordingly.

Although a specific embodiment of the present invention has been described for illustrative purposes, those skilled in the art will appreciate that various modifications, additions, and substitutions are possible, without departing from the scope and the spirit of the invention as disclosed in the accompanying claims.

What is claimed is:

1. A method for manufacturing a semiconductor device having a vertical transistor, comprising the steps of:
    forming hard masks on a semiconductor substrate such that portions of the semiconductor substrate are exposed;
    etching the exposed portions of the semiconductor substrate to define grooves therein, wherein the grooves comprise first grooves and second grooves, the second grooves being formed beneath the first grooves and having a width greater than that of the first grooves;
    forming a gate conductive layer on the hard masks and surfaces of the first and second grooves to a thickness, wherein the gate conductive layer does not fill the first and second grooves;
    forming a sacrificial layer on the gate conductive layer to fill the first and second grooves;
    removing a partial thickness of the sacrificial layer to expose the gate conductive layer,
    removing a portion of the gate conductive layer formed on the hard masks and on sidewalls of upper portions of the first grooves;
    removing the remaining sacrificial layer; and
    forming gates on sidewalls of the second grooves by selectively etching the gate conductive layer formed on sidewalls of lower portions of the first grooves and on bottoms of the second grooves.

2. The method according to claim 1, wherein the step of etching the exposed portions of the semiconductor substrate to define grooves comprises the steps of:
    anisotropically etching the exposed portions of the semiconductor substrate to define the first grooves;
    forming spacers on sidewalls of the first grooves and sidewalls the hard masks; and
    isotropically etching portions of the semiconductor substrate beneath the first grooves using the hard masks and the spacers as etch masks to define the second grooves.

3. The method according to claim 1, wherein the method further comprises the step of:
    after etching the exposed portions of the semiconductor substrate to define grooves and before forming the gate conductive layer, forming a gate insulation layer on the hard masks and surfaces of the first and second grooves.

4. The method according to claim 1, wherein the gate conductive layer comprises a polysilicon layer.

5. The method according to claim 1, wherein the sacrificial layer is formed as any one oxide layer among a high density plasma layer, a borophosphosilicate glass layer, a spin-on dielectric layer, a tetraethyl orthosilicate layer, an undoped silicate glass layer, and an atomic layer deposition.

6. The method according to claim 1, wherein the sacrificial layer is formed to a thickness in the range of 500~6,000 Å.

7. The method according to claim 1, wherein the step of forming the gates is implemented by anisotropically etching the gate conductive layer.

8. The method according to claim 1, wherein the hard masks comprise a stacked structure of a pad oxide layer and a pad nitride layer.

9. The method according to claim 8, wherein the pad nitride layer is formed to a thickness in the range of 500~1,000 Å.

10. The method according to claim 1, wherein the step of removing the partial thickness of the sacrificial layer to expose the gate conductive layer is implemented through at least one of a chemical mechanical polishing (CMP) process and an etch-back process.

11. The method according to claim 10, wherein the CMP process is conducted using a slurry having polishing selectivity in the range of 100:1~300:1 between an oxide layer and a polysilicon layer.

12. The method according to claim 10, wherein the CMP process is conducted using a ceria slurry.

13. The method according to claim 1, wherein the step of removing the portion of the gate conductive layer formed on the hard masks and on the sidewalls of the upper portions of the first grooves is implemented through a wet etching process.

14. The method according to claim 13, wherein the wet etching process is conducted using $HNO_3$.

15. The method according to claim 13, wherein the wet etching process is conducted using a chemical having etching selectivity in the range of 150:1~300:1 between a polysilicon layer and an oxide layer.

16. The method according to claim 15, wherein the wet etching process is conducted using a chemical prepared by adding HF to $HNO_3$.

17. The method according to claim 16, wherein HF is added to $HNO_3$ at a rate in the range of 0.1~20 wt %.

18. The method according to claim 1, wherein the step of removing the remaining sacrificial layer is implemented through a wet etching process.

19. The method according to claim 18, wherein the wet etching process is conducted using HF.

* * * * *